(12) United States Patent
Lee et al.

(10) Patent No.: US 7,535,760 B2
(45) Date of Patent: May 19, 2009

(54) MEMORY DEVICES AND MEMORY SYSTEMS HAVING THE SAME

(75) Inventors: Kwang-Jin Lee, Hwaseong-si (KR); Won-Seok Lee, Suwon-si (KR); Choong-Keun Kwak, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 49 days.

(21) Appl. No.: 11/902,424

(22) Filed: Sep. 21, 2007

(65) Prior Publication Data

US 2008/0080240 A1    Apr. 3, 2008

(30) Foreign Application Priority Data

Sep. 29, 2006    (KR)    ............... 10-2006-0095889

(51) Int. Cl.
*G11C 14/00*    (2006.01)
(52) U.S. Cl. .................. 365/185.08; 365/189.05; 365/230.06
(58) Field of Classification Search ............ 365/185.08, 365/189.05, 230.06, 51, 189.02
See application file for complete search history.

(56) References Cited

U.S. PATENT DOCUMENTS

| | | | |
|---|---|---|---|
| 5,966,727 A | 10/1999 | Nishino | |
| 6,952,366 B2 * | 10/2005 | Forbes | 365/185.08 |
| 2004/0041711 A1 | 3/2004 | Loewidt | |

FOREIGN PATENT DOCUMENTS

| | | |
|---|---|---|
| JP | 08-263229 | 10/1996 |
| JP | 2004-102781 | 4/2004 |
| KR | 1020050059984 A | 6/2005 |

* cited by examiner

*Primary Examiner*—David Lam
(74) *Attorney, Agent, or Firm*—Harness, Dickey & Pierce, P.L.C.

(57) ABSTRACT

A non volatile memory device and a memory system having the same are disclosed. The non volatile memory device may include a memory cell array having a plurality of non volatile memory cells, a DRAM interface for exchanging data, a command and an address with an external device, a controller for selecting one of the memory cells in response to the address and performing a control operation for one of outputting data of the selected memory cell to the external device in response to the command and storing data received from the external device, and a DRAM buffer memory. The DRAM buffer memory has dynamic memory cells, and each of the dynamic memory cells has one transistor with a floating body.

20 Claims, 10 Drawing Sheets

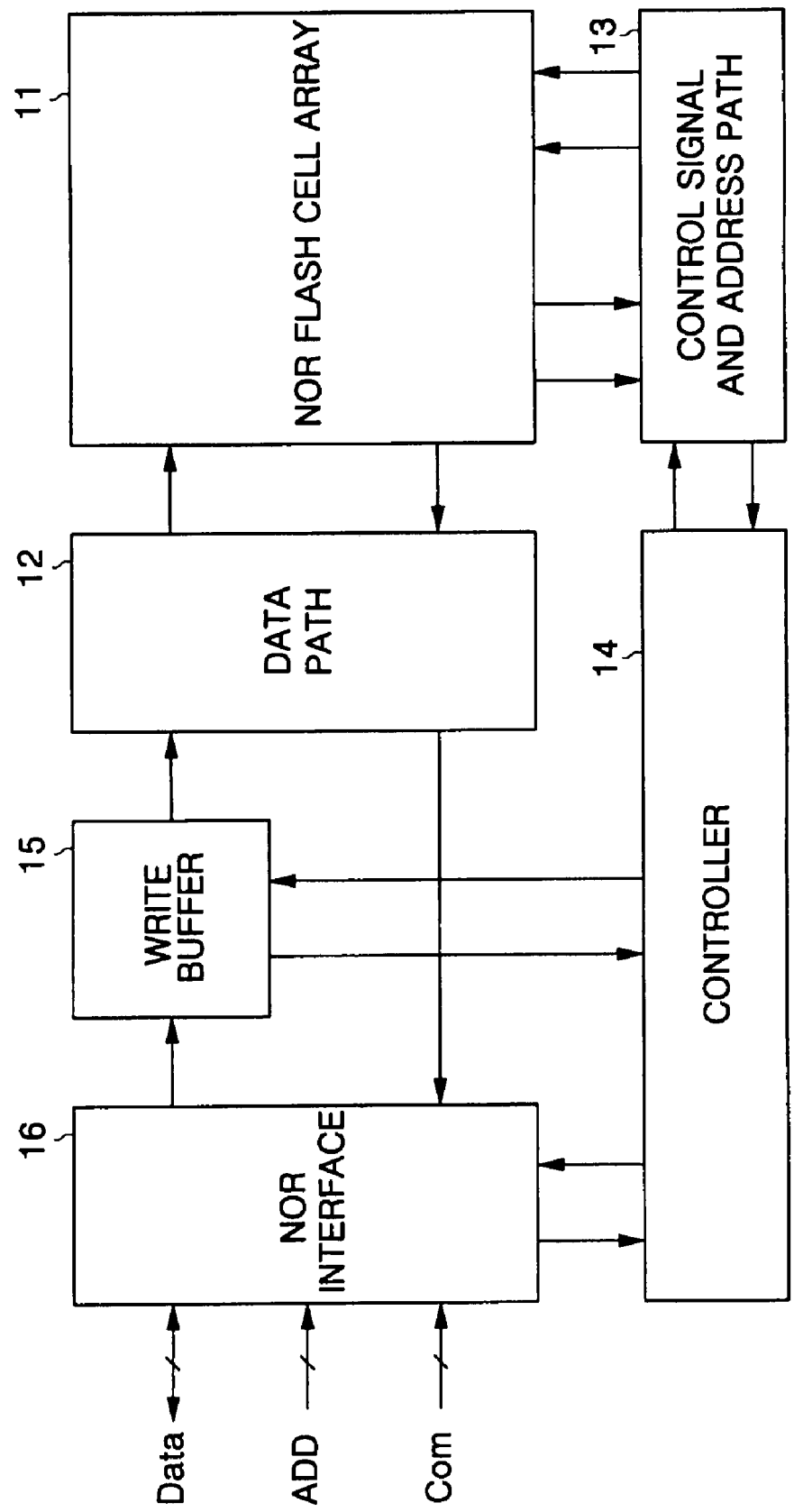

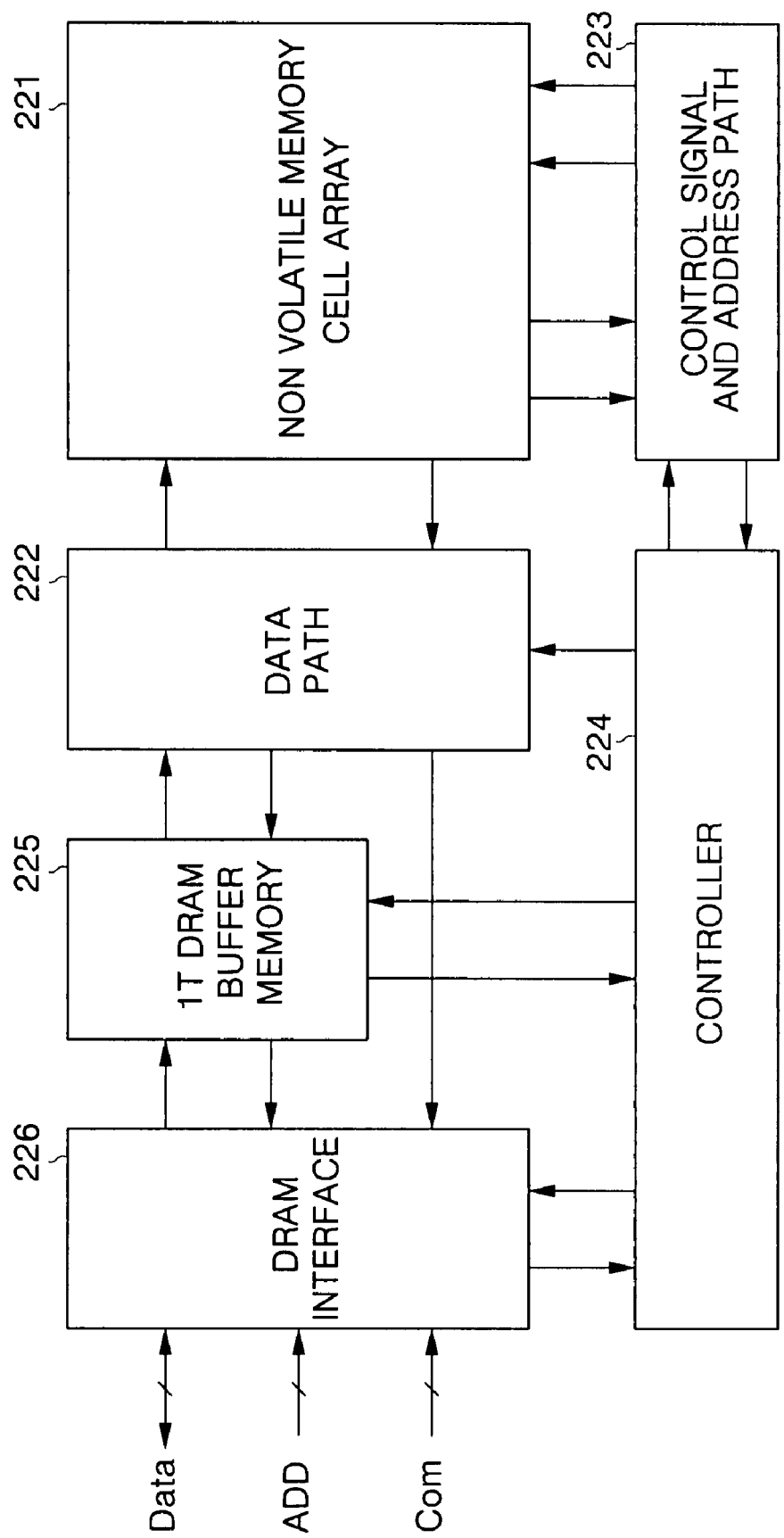

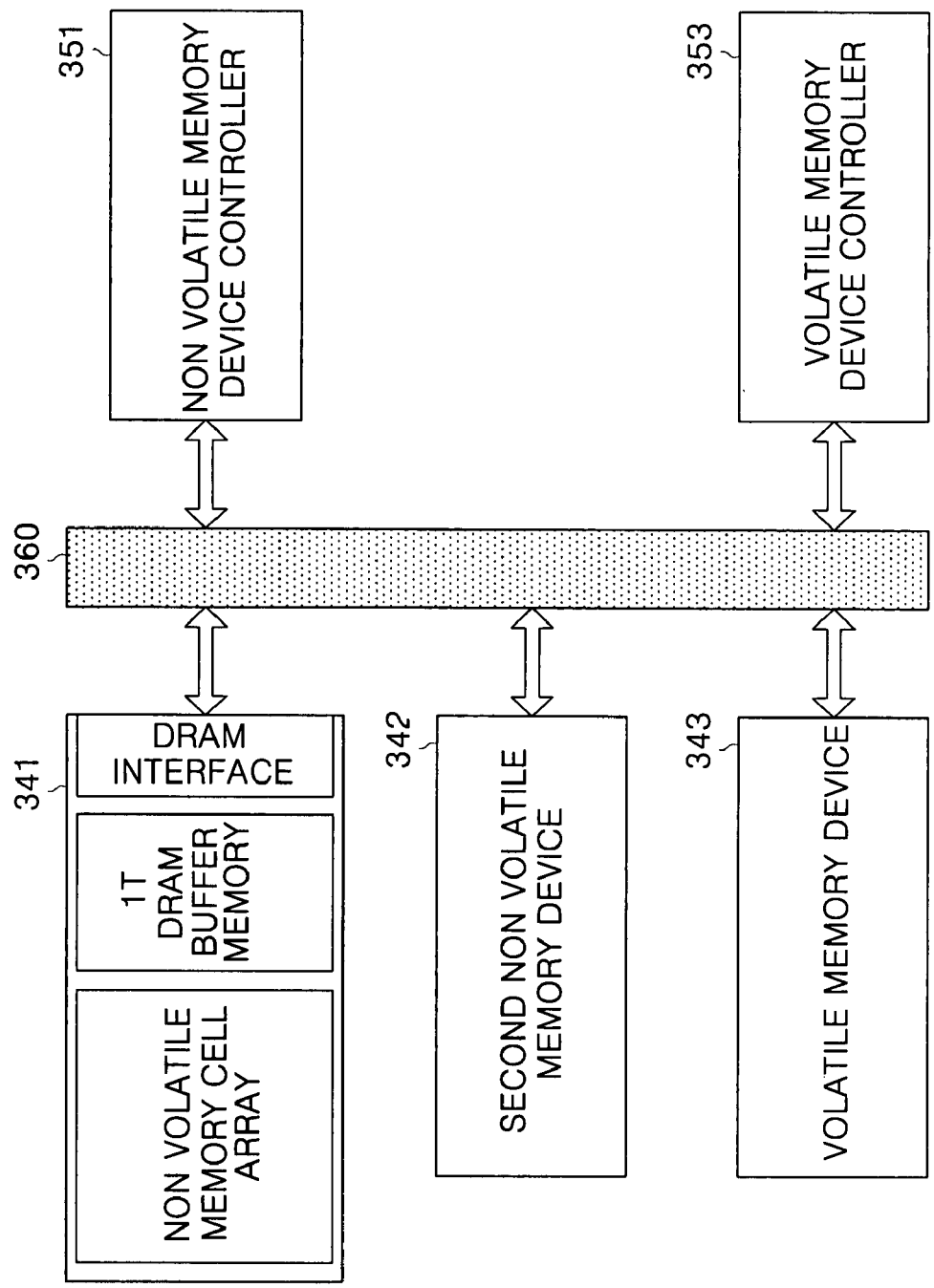

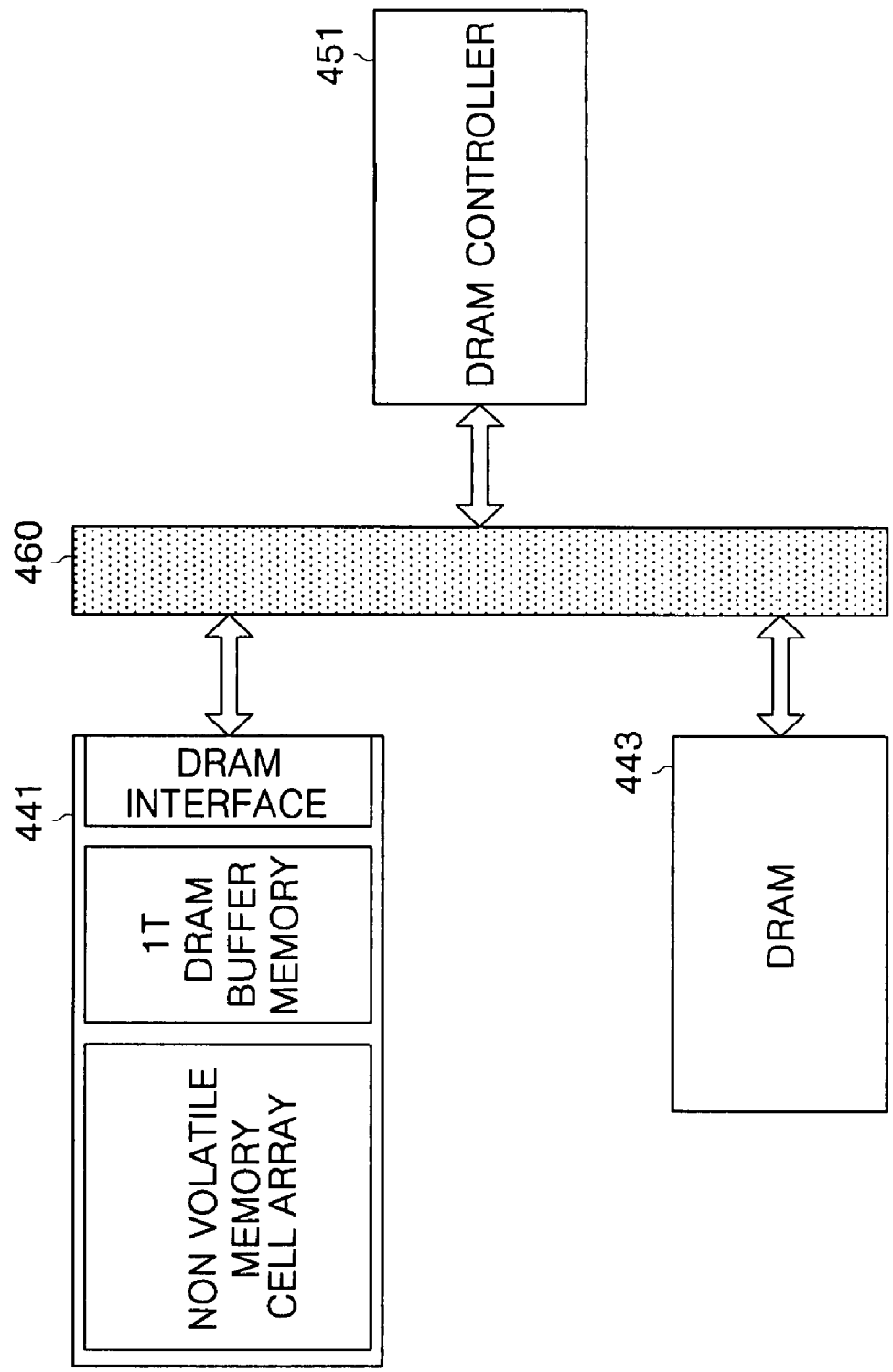

MEMORY DEVICES AND MEMORY SYSTEMS HAVING THE SAME

PRIORITY STATEMENT

This application claims the benefit of Korean Patent Application No. 2006-0095889, filed Sep. 29, 2006, the disclosure of which is incorporated herein by reference in its entirety.

BACKGROUND

1. Field

Example embodiments relate to a non volatile memory device and a memory system having the same. In particular, example embodiments relate to a non volatile memory device which has a 1 transistor (1T) DRAM as a buffer memory and a memory system having the same.

2. Description of the Related Art

A semiconductor memory device may be generally classified as a volatile memory device or a non volatile memory device. Types of volatile memory devices include a dynamic random access memory (DRAM) and a static random access memory (SRAM), whereas types of non volatile memory devices include an erasable programmable read only memory (EPROM), an electrical erasable programmable read only memory (EEPROM), and a flash memory.

Flash memory is recently attracting attention as a non volatile memory, which may be used as a substitute for other conventional storage devices because it has a small size and a large capacity. Types of conventional flash memories include a NOR flash memory in which a plurality of memory cells are arranged in parallel between a bit line and a ground line and a NAND flash memory in which a plurality of memory cells are serially arranged between the bit line and the ground line. The NOR flash memory generally provides a fast read operation since a NOR flash memory has a parallel structure and thus, can directly access a desired memory cell. The NAND flash memory has high integration characteristics compared to the NOR flash memory. A conventional flash memory device is a device which includes the NOR flash memory and/or the NAND flash memory to store data.

FIGS. 1A to 1C show conventional non volatile flash memory devices. FIG. 1A is a block diagram of a conventional NOR flash memory device, FIG. 1B is a block diagram of a conventional NAND flash memory device, and FIG. 1C is a block diagram of a conventional OneNAND flash memory device.

The conventional NOR flash memory device is described below with reference to FIG. 1A. Referring to FIG. 1A, a NOR flash cell array 11 has a NOR flash memory structure. A NOR interface 16 may perform an information converting operation and an input/output operation in order to exchange various information with an external device. The NOR interface 16 may transfer an address ADD and a command Corn received from an external device to a controller 14. The NOR interface 16 may output data Data supplied by a data path 12 to the external device during a read operation, and may output data Data received from the external device to a write buffer 15 during a write operation. The controller 14 may output various control signals such as a read control signal and a write control signal to control the NOR flash memory device in response to the address ADD and the command Com and may transmit the address ADD to a control signal and address path 13. The control signal and address path 13 may decode the address ADD received from the controller 14 to select a corresponding memory cell of the NOR flash cell array 11. The control signal and address path 13 may control the selected memory cell of the NOR flash cell array 11 in order to input and/or output data Data in response to the control signal. The data path 12 may output data Data of the selected memory cell to the NOR interface 16 during the read operation, and may transmit data Data from the write buffer 15 to store the data Data in the selected memory cell during the write operation. The write buffer 15 may receive data Data from the NOR interface 16, temporarily store the data Data and then output the data Data to the data path 12 during the write operation. During the read operation, the NOR flash memory device may directly access a memory cell of the NOR flash cell array 11 to output data, and thus the NOR flash memory device generally has a fast operation speed. However, the NOR flash memory device performs write and/or erasing operation in a block unit having a number of memory cells, and so the write buffer 15 is used during the write and/or erasing operations in order to reduce an operation speed difference with the external device.

In the NAND flash memory device of FIG. 1B, a NAND flash cell array 11 has a NAND flash memory structure. A controller 24 and a control signal and address path 23 operate in substantially the same manner as the controller 14 and the control signal and address path 13 previously described with respect to FIG. 1A. A NAND interface 26 also performs an information converting operation and an input/output operation in order to exchange various information with the external device. However, the NOR interface 16 and the NAND interface 26 differ in designated protocol.

The NAND flash memory device operates based on a page unit having a number of memory cells during the read operation as well as the write and erasing operations, and thus includes a page buffer 25 in order to reduce an operation speed difference with the external device. The page buffer 25 may receive data Data from the NAND interface 26, temporarily store the data DATA, and then output the data Data to the data path 22 during the write operation. The page buffer 25 may also temporarily store data Data from the data path 22 and output the Data to the NAND interface 26 during the read operation.

FIG. 1C shows the OneNAND flash memory device. Generally, a conventional NAND flash memory has a slow driving speed because memory cells are serially connected and slow operation speed because the NAND flash memory reads data in a page unit. A conventional NOR flash memory device has a fast driving speed because memory cells are connected in parallel and a fast operation speed because the NOR flash memory device can directly access a selected memory cell. However, a conventional NOR flash memory device generally has low integration. The conventional OneNAND flash memory includes a NAND flash cell array 31 which has high integration as a cell array and a NOR interface 36 for exchanging information with the external device. The OneNAND flash memory includes a buffer memory 35 in order to overcome a speed difference and a processing unit (e.g., block, page, and memory cell) difference during read and write operation between the NAND flash cell array 31 and the NOR interface 36. A SRAM which is fast in operation speed is usually used as the buffer memory 35.

As shown in FIGS. 1A to 1C, there exist various interfaces 16, 26 and 36 for a flash memory device among the conventional non volatile memory devices. In order to drive various non volatile memory devices, the external device should have various memory controllers. In particular, in case of driving the volatile memory devices, as well as the non volatile memory devices, the types of memory controllers that the external device generally includes is increased.

FIG. 2 is a block diagram illustrating a memory system having a conventional volatile memory device and a conventional non volatile memory device.

A first non conventional volatile memory device 41 and a second conventional non volatile memory device 42 shown in FIG. 2 are different in type and may be EPROMs, EEPROMs, or various flash memory devices, for example. Thus, the first non volatile memory device 41 and the second non volatile memory device 42 have different interfaces. A volatile memory device 43 is a DRAM or a SRAM, for example.

Because the first and second non volatile memory devices 41 and 42 and the volatile memory device 43 have different interfaces, the memory system shown in FIG. 2 has a different controller for each of the memory devices. Thus, the memory system of FIG. 2 includes a first non volatile memory device controller 51 for the first non volatile memory device 41, a second non volatile memory device controller 52 for the second non volatile memory device 42, and a volatile memory device controller 53 for the volatile memory device controller 43.

A memory bus 60 may transmit data and commands between the memory devices 41, 42 and 43 and the corresponding memory device controllers 51, 52 and 53.

That is, as shown in FIG. 2, the conventional memory system has a plurality of memory controllers 51, 52 and 53 to individually control the memory devices 41, 42 and 43, and thus has low efficiency because the conventional memory system is large in size, high in power consumption and high in price.

In order to solve the above problems of a conventional memory system, such as the one shown in FIG. 2, a non volatile memory device which has a volatile memory cell such as a DRAM or SRAM as a buffer memory to unify the interface has been suggested. However, this conventional solution has a problem in that there is a limitation to an applicable memory type and may result in an increase in the size of the memory device.

Further, a memory cell of a DRAM typically includes one transistor and one capacitor. Discrimination on whether data is "0" or "1" depends on whether the capacitor is charged or not. That is, the existing DRAM must have the capacitor to store the data.

However, in the semiconductor memory device which pursues high integration, the memory cell having such a capacitor becomes an obstacle which makes it difficult to reduce the layout area size of the semiconductor memory device.

SUMMARY

Example embodiment provide memory systems and non volatile memory devices in which a 1T DRAM is used as a buffer memory to thereby support a single interface and thus, the size of the memory systems and memory devices may be reduced.

An example embodiment provides a non volatile memory device. The non volatile memory device may include a memory cell array having a plurality of non volatile memory cells; a DRAM interface for exchanging data, a command and an address with an external device; a controller for selecting one of the memory cells in response to the address and performing a control operation for one of outputting data of the selected memory cell to the external device in response to the command and storing data received from the external device; and a DRAM buffer memory. The DRAM buffer memory has a plurality of dynamic memory cells, and each of the dynamic memory cells have one transistor with a floating body. The DRAM buffer memory performs at least one of receiving and buffering data from the memory cell array and outputting the buffered data to the DRAM interface in response to the control operation of the controller and buffering data received from the DRAM interface and outputting the buffered data to the memory cell array.

Another example embodiment provides a memory system. The memory system may include at least one non volatile memory device including a memory cell array having a plurality of non volatile memory cells, a DRAM interface for exchanging information with an external device, and a DRAM buffer memory having a plurality of dynamic memories, the dynamic memory including at least one transistor having a floating body; a memory controller for controlling the at least one non volatile memory device; and a memory bus for transmitting the information between the at least one non volatile memory device and the memory controller. Still another example embodiment provides a memory system. The memory system may include a first non-volatile memory device; a second non-volatile memory device different from the first non-volatile memory device; a single controller controlling both the first non-volatile memory device and the second non-volatile memory device; and a DRAM buffer having a plurality of dynamic memories. Each of the dynamic memories includes one transistor having a floating body and no capacitor. The DRAM buffer is interposed between the first non-volatile memory device, the second non-volatile memory device, and the single controller and enables data to be passed from the single controller and the first non-volatile memory device and the second non-volatile memory device using a common protocol for both the first non-volatile memory device and the second non-volatile memory device.

BRIEF DESCRIPTION OF THE DRAWINGS

The above and other features, aspects and advantages of example embodiments will become more apparent from a review of the detailed description, which refers to the attached drawings in which:

FIGS. 1A to 1C are block diagrams illustrating flash memory devices as exemplary conventional non volatile memory devices;

FIG. 4 is a block diagram illustrating a non volatile memory device according to an exemplary embodiment of the present invention;

FIGS. 6A and 6B are block diagrams illustrating memory systems having the non volatile memory device according to the exemplary embodiment of the present invention.

DETAILED DESCRIPTION OF EXAMPLE EMBODIMENTS

Figure 1B:
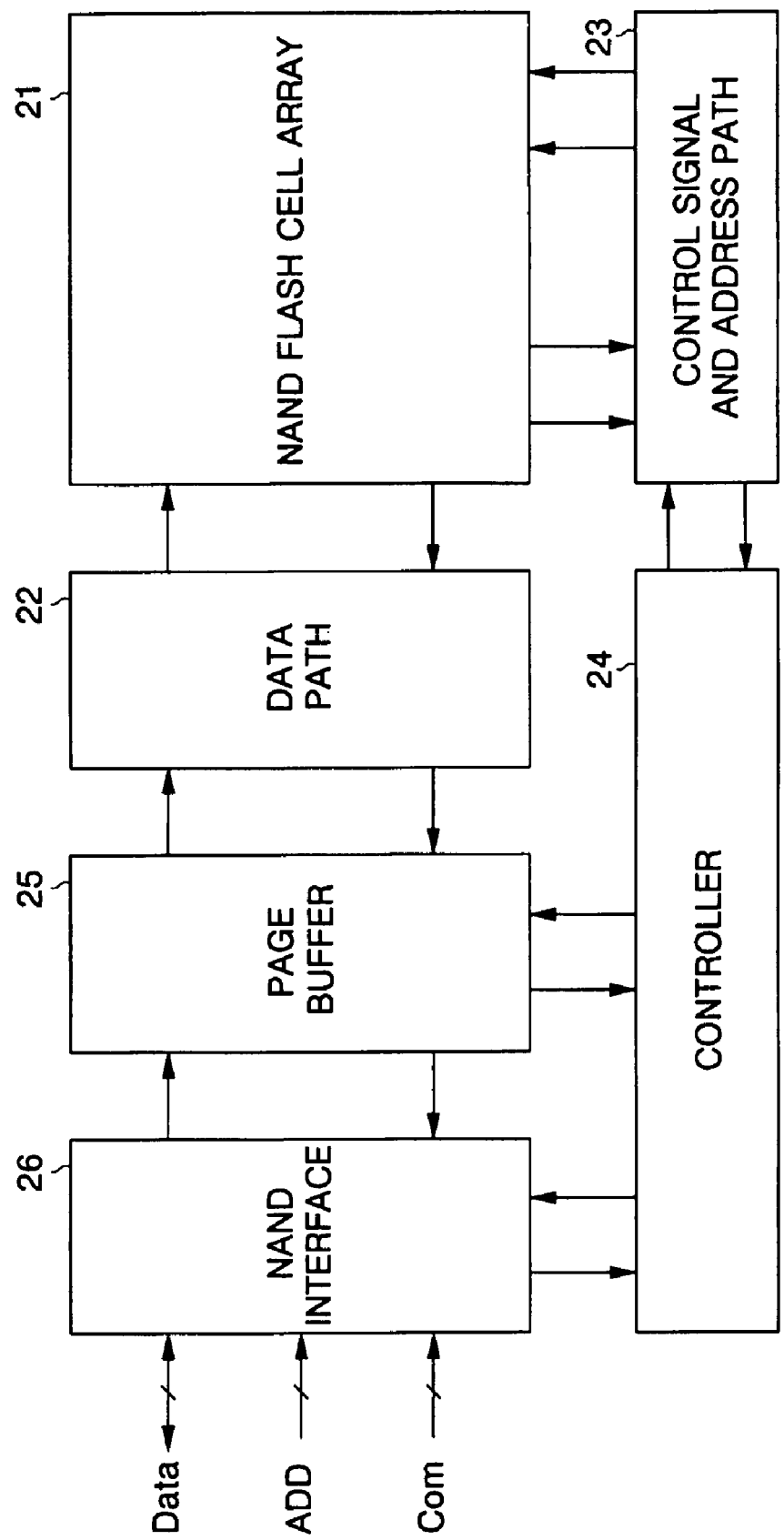
Figure 1C:
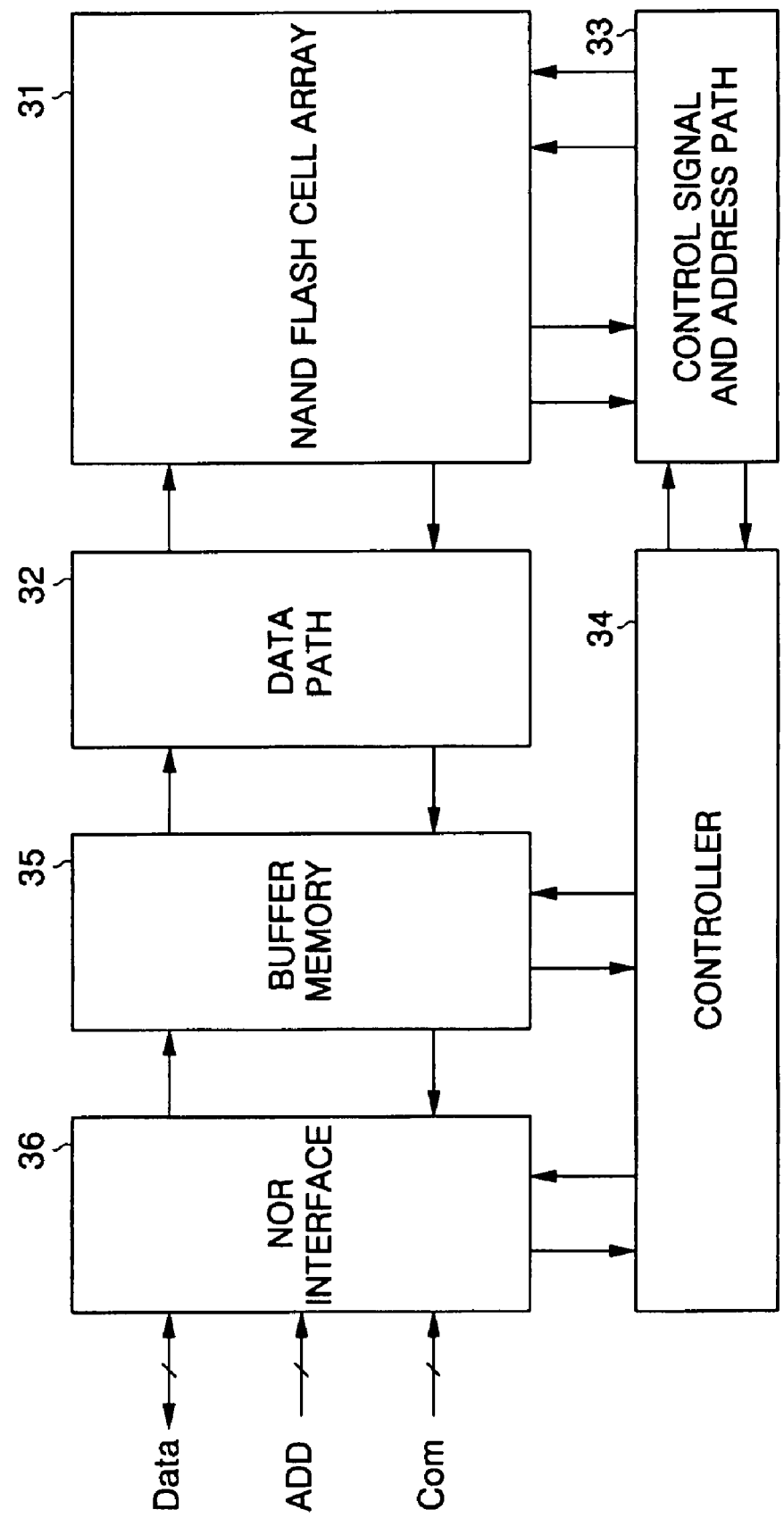

Various example embodiments will now be described more fully with reference to the accompanying drawings. However, specific structural and functional details disclosed herein are merely representative for purposes of describing example embodiments, and one skilled in the art will appreciate that example embodiments may be embodied in many alternate forms and should not be construed as limited to only the embodiments set forth herein.

It should be understood that, although the terms first, second, etc. may be used herein to describe various elements, these elements should not be limited by these terms. These terms are only used to distinguish one element from another. For example, a first element could be termed a second element, and similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a similar fashion (e.g., "between" versus "directly between", "adjacent" versus "directly adjacent", etc.).

The terminology used herein is for the purpose of describing example embodiments only and is not intended to be limiting of the example embodiments. As used herein, the singular forms "a", "an" and "the" are intended to include the plural forms as well, unless the context clearly indicates otherwise. It will be further understood that the terms "comprises", "comprising", "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Example embodiments described below with respect to the drawings are provided so that this disclosure will be thorough, complete and fully convey the concept of example embodiments to those skilled in the art. In the drawings, like numbers refer to like elements throughout. Further, the thicknesses of layers and regions are exaggerated for clarity in the drawings.

An example embodiment of semiconductor memory device in which a memory cell does not need a capacitor and includes only one transistor is introduced below. An example embodiment of a semiconductor memory device includes a memory cell having a transistor with a floating body which is called a floating body cell (FBC).

The transistor may store a plurality of carriers in the floating body. A threshold voltage of the transistor changes due to a body effect depending on whether a plurality of carriers are stored or not, and the changed threshold voltage of the transistor leads to a change in the amount of an electric current, which can be used to discriminate data according to an example embodiment.

A plurality of carriers stored in the floating body are recombined and disappear after a time duration. Thus, a periodic refreshing operation to maintain data is provided. A DRAM realized by memory cells having such a floating body is called a 1T DRAM.

Figure 3A:
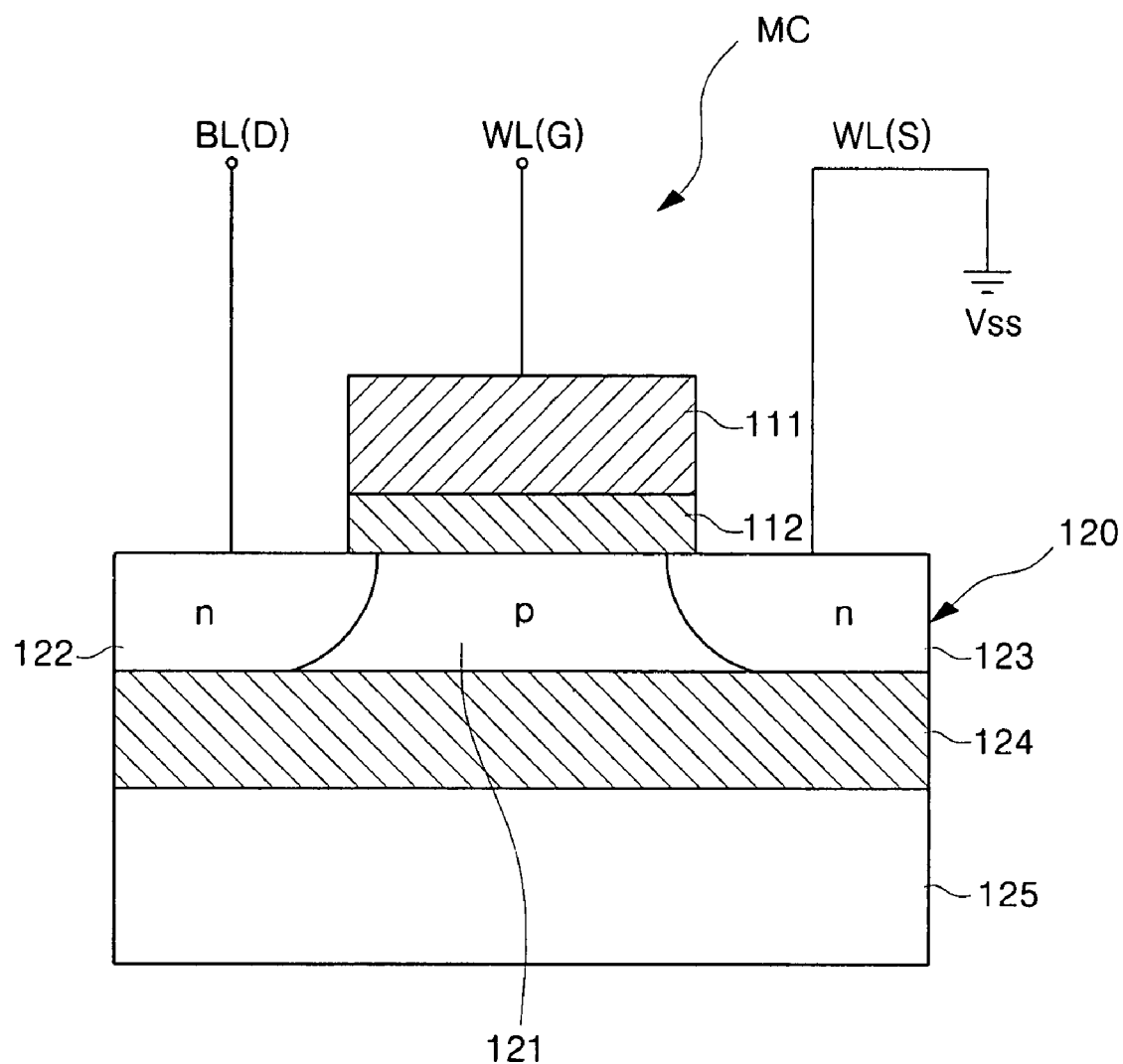
FIG. 3A is a cross-sectional diagram illustrating a memory cell having no capacitor.
Figure 3B:
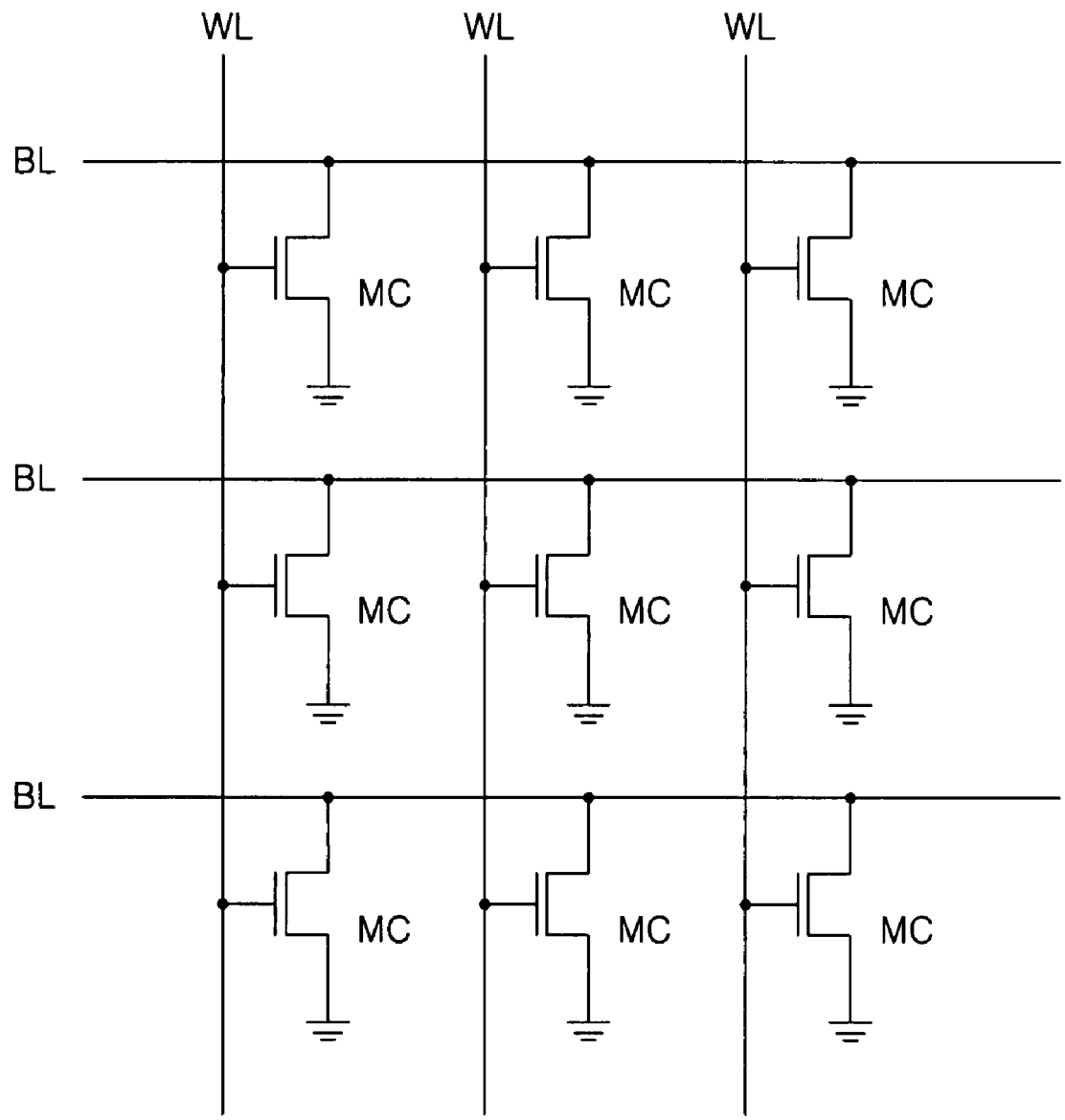
FIG. 3B is a circuit diagram illustrating a structure of a memory cell array having the memory cell of FIG. 3A.

FIG. 3A is a cross-sectional diagram illustrating a memory cell having no capacitor according to an example embodiment, and FIG. 3B is a circuit diagram illustrating an example embodiment of a structure of a memory cell array having a plurality of memory cells such as the memory cell shown in FIG. 3A.

The memory cell MC of FIG. 3A may be formed as follows. First, an insulating layer 124 is formed on a semiconductor substrate 125, and a p-type semiconductor layer 120 is formed on the insulating layer 124. Stated differently, the memory cell MC may be formed on a silicon on insulator (SOI) substrate according to an example embodiment. N-type drain and source regions 122 and 123 are formed in the p-type semiconductor layer 120, for example. The drain and source regions 122 and 123 are formed at a sufficient depth to contact the insulating layer 124. A portion of the p-type semiconductor layer 120 between the drain and source regions 122 and 123 serves as a floating body 121 according to an example embodiment. The floating body 121 is isolated from other memory cells by the drain and source regions 122 and 123 and the insulating layer 124 to become a floating state. A gate electrode 111 is formed over the floating body 121, and a gate insulating layer 112 is formed between the gate electrode 111 and the floating body 121.

Referring to FIGS. 3A and 3B, the memory cell MC, which includes an NMOS transistor having the floating body 121 is arranged between a word line WL and a bit line BL. The memory cell MC is connected to the word line via the gate electrode 111, to the bit line BL via the drain region 122, and to a ground voltage Vss via the source region 123 in the example shown in FIGS. 3A and 3B.

In order to write data "1" in the memory cell MC, the NMOS transistor which constitutes the memory cell MC is operated in a saturation region. Stated differently, if a first voltage of a first level (e.g., 1.5 volts) is applied to the gate electrode 111 via the word line WL and a second voltage (e.g., 1.5 volts) which is equal to or higher than the first voltage is applied to the drain region 122 via the bit line BL, a large amount of electron-hole pairs are generated in a portion of the floating body 121 adjacent to the drain region 122 due to impact ionization. The electrons are absorbed into the drain region 122, but the holes are stored in the floating body 121.

A voltage of the floating body 121 reaches a balance state if an electric current for generating the holes by the impact ionization and a forward electric current of a pn junction between the floating body 121 and the source region 123 are balanced with each other. That is, a state in which the holes are stored in the floating body 121 is a state that data "1" is stored.

In order to write data "0" in the memory cell MC, a first voltage of a first level (e.g., 1.5 volts) is applied to the gate electrode 111 via the word line WL, and a third voltage (e.g., −1.5 volts) which is lower than the first voltage is applied to the drain region 122 via the bit line BL, so that the floating body 121 which is the p-type region and the drain region 122 which is the n-type region in the example of FIGS. 3A and 3B are biased in a forward direction and most of the holes stored in the floating body 121 are absorbed into the drain region 122. A state that the number of holes is reduced is a state that data "0" is stored.

When data "1" is stored, it becomes a state that a large number of holes are stored in the floating body of the NMOS transistor, and thus a threshold voltage of the NMOS transistor is reduced by the body effect. When data "0" is stored, it becomes a state that the holes stored in the floating body of the NMOS transistor are reduced, and thus a threshold voltage is increased.

The NMOS transistor is operated in a linear region while reading data from the memory cell MC according to an example embodiment. When a first voltage of a first level (e.g., 1.5 volts) is applied to the gate electrode 111 via the word line WL and a fourth voltage (e.g., 0.2 volts) for operating the NMOS transistor in the linear region is applied to the drain region 122 via the bit line BL, an electric current difference occurs in the bit line due to a variation of the threshold voltage which occurs because of a difference of the number of holes stored in the floating body 121 according to an example embodiment. The 1T DRAM may detect the electric current difference to discriminate data "0" and data "1". According to an example embodiment, the electric current applied to the bit line BL during the read operation is increased since the threshold voltage is low when data "1" is stored in the memory cell MC, whereas the electric current applied to the bit line BL during the read operation is reduced since the threshold voltage is high when data "0" is stored in the memory cell MC.

According to an example embodiment, the 1T DRAM has a reference memory cell (not shown) which stores data "0" and data "1" and generates a reference signal for comparing and discriminating data outputted from the memory cell MC. Also, in the 1T DRAM, a sense amplifier may detect the reference signal and data of the memory cell MC by using the electric current difference, and thus the current sense amplifier may be used.

In the conventional DRAM, the bit line and the reverse bit line are operated as a pair, but the 1T DRAM does not have the reverse bit line but a reference bit line connected to the reference memory cell. However, one reverse bit line is arranged per each bit line, whereas one reference bit line is arranged per a number of bit lines.

A 1T DRAM has high integration because the memory cells do not have the capacitor. Since the 1T DRAM is easy to realize, when used together with a different type of memory cell array, a multi-layer structure can be employed, and thus the layout area size of the memory device may not increase.

FIG. 4 is a block diagram illustrating an example embodiment of a non volatile memory device. The non volatile memory device of FIG. 4 includes the 1T DRAM of FIGS. 3a and 3b as a buffer memory 225.

The non volatile memory cell array 221 includes a non volatile memory cell such as a NAND flash cell array or a NOR flash cell array, for example. The DRAM interface 226 converts information in a designated method like a DRAM and may input and output the information in order to exchange various information with an external device. The DRAM interface 226 transfers the address ADD and the command Com received from the external device to the controller 224. The DRAM interface 226 outputs the data Data received from the 1T DRAM buffer memory 225 to the external device during an example read operation and outputs the data Data received from the external device to the 1T DRAM buffer memory 225 during an example write operation. The controller 224 outputs various control signals such as a read control signal and a write control signal, for example, to control the non volatile memory device in response to the address ADD and the command Com and transmits the address ADD to the control signal and address path 223. The control signal and address path 223 decodes the address ADD received from the controller 224 to select corresponding memory cells of the non volatile memory cell array 221. The control signal and address path 223 controls the selected memory cell of the non volatile memory cell array to receive or output the data Data in response to the control signal. The data path 222 outputs the data Data of the selected memory cell of the non volatile memory cell array 221 to the 1T DRAM buffer memory 225 during the example read operation of the non volatile memory device, and transmits the data Data received from the 1T DRAM buffer memory 225 to the memory cell array 221 so that the data Data can be stored in the selected memory cell during the example write operation. The 1T DRAM buffer memory 225 receives the data from the DRAM interface 226, temporarily stores the data and outputs the data to the data path 222 during the example write operation. The 1T DRAM buffer memory 225 receives the data from the data path 222, temporarily stores the data and outputs the data to the DRAM interface 226 during the example read operation. The data path 222 may output the data of the NOR flash memory cell array 11 directly to the DRAM interface 226 during the data example read operation in a case where the non volatile memory cell array 221 is a NOR flash memory cell array. The NOR flash memory cell provides the fast data read operation because the memory cell arrays are connected in parallel and thus, the corresponding memory cell can be directly accessed and does not necessarily need the buffer memory.

In FIG. 4, if the memory cell of the non volatile memory device is a non volatile memory cell such as an EPROM, an EEPROM, a NOR flash memory, and a NAND flash memory, the 1T DRAM buffer memory 225 and the DRAM interface 226 are provided as the interface, so that the interface for the external device is unified as the DRAM interface 226.

Figure 5A:
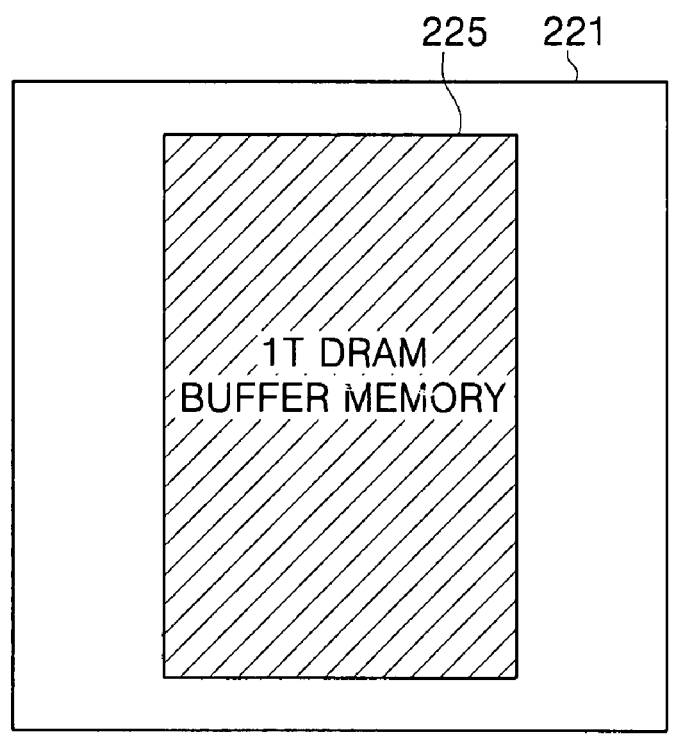
FIGS. 5A and 5B show a layout for realizing the non volatile memory cell array and a 1T DRAM buffer memory in the non volatile semiconductor memory device of FIG. 4.
Figure 5B:
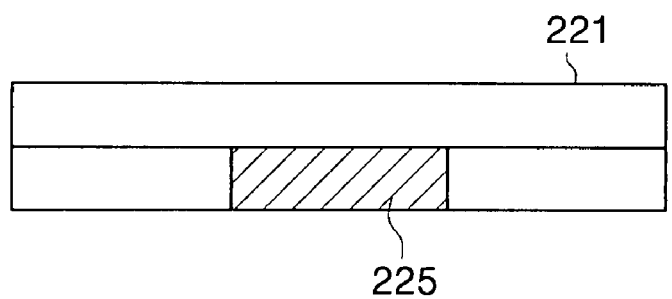

FIGS. 5A and 5B show a layout for realizing the non volatile memory cell array and the 1T DRAM buffer memory in a non volatile semiconductor memory device. Referring to FIGS. 5A and 5B, the 1T DRAM buffer memory 225 is formed below the non volatile memory cell array 221. As described above, since each memory cell does not have a capacitor and is realized by one transistor, the 1T DRAM is small in size and easy to be realized on the semiconductor substrate according to an example embodiment. Also, the thickness of the realized memory cell is thin. Thus, the buffer memory of the non volatile memory device can be realized without increasing the layout area size by implementing a multiple-layer structure in which the 1T DRAM buffer memory 225 is formed and the non volatile memory cell array 221 is formed on the 1T DRAM buffer memory 225. There is no need for providing various controllers for respectively controlling various non volatile memory devices according to an example embodiment because the 1T DRAM buffer memory 225 is arranged so that the interfaces of the non volatile memory devices are unified to the DRAM interface 226.

FIGS. 6A and 6B are block diagrams illustrating memory systems having an example embodiment of a non volatile memory device.

In FIG. 6A, the first non volatile memory device 341 and the second non volatile memory device 342 may be different types of non volatile memory devices such as an EPROM, EEPROM, NOR flash memory, and NAND flash memory, for example. Each of the first and second non volatile memory devices 341 and 342 include the non volatile memory cell array 221, the 1T DRAM buffer memory 225, and the DRAM interface 226 previously described with respect to FIG. 4. The 1T DRAM buffer memory 225 may be arranged below the non volatile memory cell array 221 as previously described with respect to FIG. 5. The non volatile memory device 341 exchanges information with the external device through the DRAM interface 226. Thus, the external device may control the first and second non volatile memory devices 341 and 342 in the same way as the DRAM. The volatile memory device 343 shown in FIG. 6A may include a DRAM or SRAM, for example.

Figure 2:
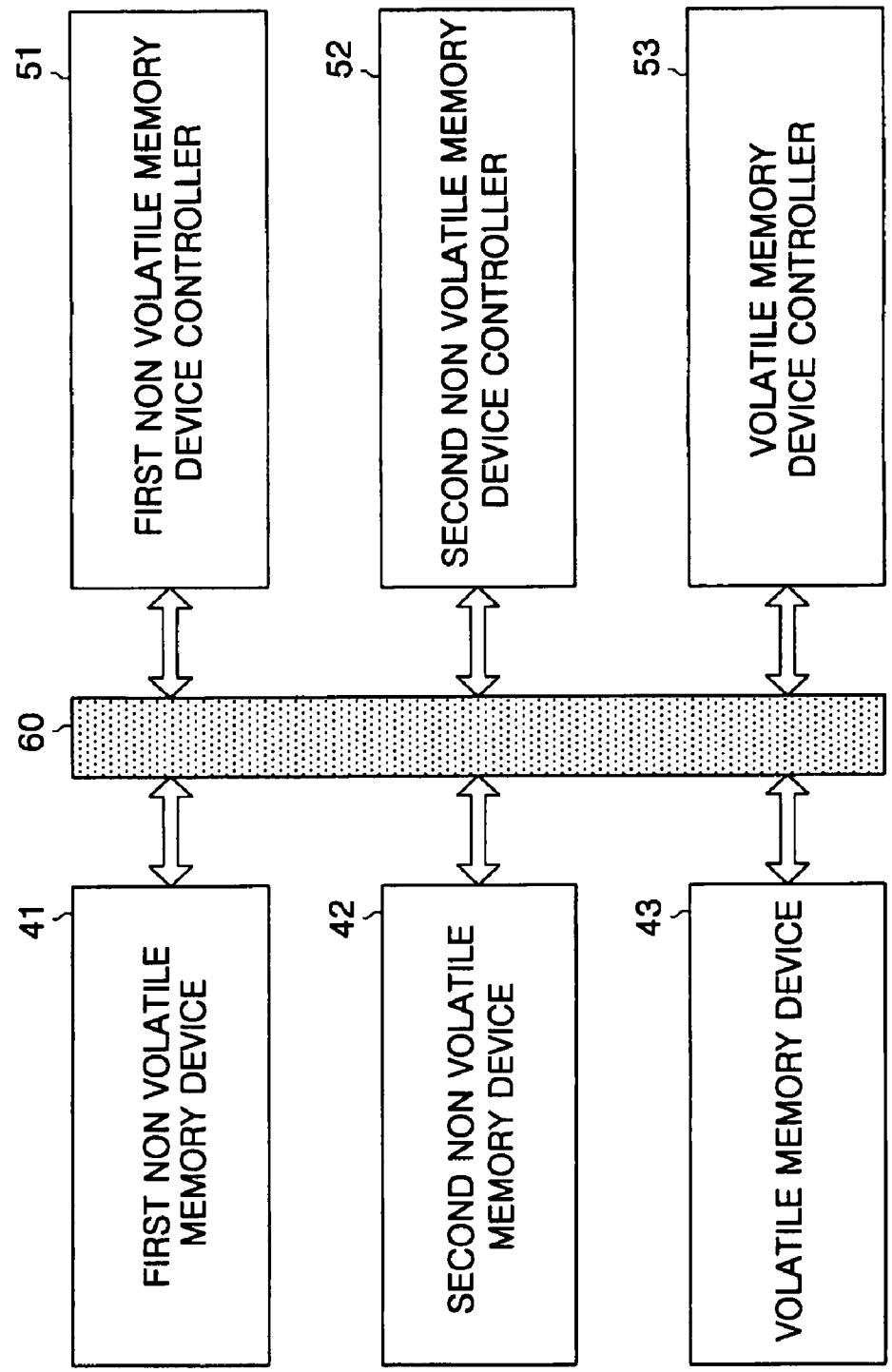
FIG. 2 is a block diagram illustrating a memory system having a conventional volatile memory device and a conventional non volatile memory device.

The memory system of FIG. 6A has one non volatile memory device controller 351 for the two different types of non volatile memory devices 341 and 342 unlike the conventional memory system described with respect to FIG. 2. Since the interfaces of the first and second non volatile memory devices 341 and 342 may be same as the DRAM interface according to an example embodiment, various memory device controllers for the respective memory devices may not be needed. Stated differently, the memory system of FIG. 6A has one non volatile memory device controller 351 for the first and second non volatile memory devices 341 and 342 to control the two non volatile memory devices 341 and 342. It is noted that the number of the non volatile memory devices controlled by one non volatile memory device controller is not limited to two. However, the memory system of FIG. 6A has a volatile memory device controller 353, which may be different from the non volatile memory device controller 351. This may be because the non volatile memory device controller 351 supports only the DRAM interface and thus the volatile memory device having the interface of a different type such as the SRAM is separately controlled.

A memory bus 360 transmits data and commands between the memory device controllers 351 and 352 and the memory devices 341, 342 and 343.

FIG. 6B is a block diagram illustrating an example embodiment of a memory system having a DRAM as the volatile memory device. In FIG. 6A, because the type of the volatile memory device is not designated, various volatile memory devices can be applied, and the non volatile memory device controller 351 having the DRAM interface may not be able to control the volatile memory device 343. However, in FIG. 6B, DRAM 443 is used as the volatile memory device.

A non volatile memory device 441 is a memory device such as EPROM, EEPROM, NOR flash memory, and NAND flash memory. The non volatile memory device 441 includes the non volatile memory cell array 221, the 1T DRAM buffer memory 225, and the DRAM interface 226. The DRAM buffer memory 225 may be arranged below the non volatile memory cell array 221 as previously described.

The DRAM 443 which is the volatile memory device has the DRAM interface and exchanges information with the external device in a method designated by the external device and the DRAM interface.

In the example embodiment shown in FIG. 6B, both the non volatile memory device 441 and the DRAM 443 use a DRAM interface to receive and output the information. Still referring to FIG. 6B, the memory system has one memory device controller 451 to control the non volatile memory devices 441 and the DRAM 443. In the memory system of FIG. 6B, since all memory devices may use a single interface, i.e., the DRAM interface, all the memory devices may be controlled using one memory device controller 451.

A memory bus 460 transmits data and commands between the memory device controller 451 and the respective memory devices 441 and 443.

The example embodiments of the memory systems shown in FIGS. 6A and 6B reduce the number of the non volatile memory device controllers for controlling the non volatile memory devices because the non volatile memory devices have the 1T DRAM buffer and the interface is unified to the DRAM interface. For example, in a case where the DRAM 443 is used as the volatile memory device, the DRAM 443 and the various non volatile memory devices 441 can be controlled by using only one memory device controller 451.

As described above, in an example embodiment of a non volatile memory device having the 1T DRAM as the buffer memory, which may be included in a memory system, the buffer memory of the non volatile memory device is realized by the 1T DRAM, and the interfaces are unified to a single interface. Because the 1T DRAM has high integration and is easy to realize, the buffer memory can be formed below the non volatile memory cell array, which may significantly reduce the size of the non volatile memory device. Further, the memory system having the non volatile memory device, which has the 1T DRAM as the buffer memory, may control a plurality of non volatile memory devices using one memory controller regardless of the number of non volatile memory devices. In case where the non volatile memory device is used together with the DRAM in the memory system, the DRAM controller may also be used to control the non volatile memory device. Accordingly, the non volatile memory device having the 1T DRAM as the buffer memory and the memory system is low in cost and power consumption because a single interface is provided to various non volatile memory devices and the size of the non volatile memory device can be significantly reduced.

What is claimed is:

1. A non volatile memory device, comprising:
   a memory cell array having a plurality of non volatile memory cells;
   a DRAM interface for exchanging data, a command and an address with an external device;
   a controller for selecting one of the memory cells in response to the address and performing a control operation for one of outputting data of the selected memory cell to the external device in response to the command and storing data received from the external device; and
   a DRAM buffer memory having a plurality of dynamic memory cells, each of the dynamic memory cells having one transistor with a floating body, the DRAM buffer memory performing one of receiving and buffering data from the memory cell array and outputting the buffered data to the DRAM interface in response to the control operation of the controller and buffering data received from the DRAM interface and outputting the buffered data to the memory cell array.

2. The non volatile memory device of claim 1, wherein the DRAM buffer memory is arranged on a semiconductor substrate, and the memory cell array is arranged on the DRAM buffer memory.

3. The non volatile memory device of claim 1, wherein the DRAM interface exchanges the data, the command and the address with the external device in the same way as a DRAM.

4. The non volatile memory device of claim 1, wherein the plurality of memory cells are divided into blocks having a number of memory cells.

5. The non volatile memory device of claim 4, wherein the memory cell array receives and outputs data in block units.

6. The non volatile memory device of claim 1, further comprising:
   a data path for receiving and outputting data between the memory cell array and the DRAM buffer memory in response to the control operation of the controller.

7. The non volatile memory device of claim 6, wherein the data path outputs data to the DRAM buffer memory in response to the control operation of the controller when the non volatile memory cell of the memory cell array performs an input or output operation in a block unit having a number of memory cells.

8. The nonvolatile memory device of claim 6, wherein the data path outputs data to the DRAM interface when the non volatile memory cell of the memory cell performs an input or output operation in a memory cell unit.

9. A memory system, comprising:
at least one non volatile memory device including a memory cell array having a plurality of non volatile memory cells, a DRAM interface for exchanging information with an external device, and a DRAM buffer memory having a plurality of dynamic memories, the dynamic memory including at least one transistor having a floating body;
a memory controller for controlling the at least one non volatile memory device; and
a memory bus for transmitting the information between the at least one non volatile memory device and the memory controller.

10. The memory system of claim 9, wherein the memory controller controls the non volatile memory device in the same as a DRAM.

11. The memory system of claim 9, wherein the DRAM buffer memory is arranged on a semiconductor substrate, and the memory cell array is arranged on the DRAM buffer memory.

12. The memory system of claim 9, wherein the DRAM interface receives or outputs data, a command and an address as the information.

13. The memory system of claim 12, further comprising,
a controller for selecting one of the memory cells in response to the address and performing a control operation for one of outputting data of the selected memory cell to the external device in response to the command and storing data received from the external device; and
a data path for at least one of receiving and outputting data between the memory cell array and the DRAM buffer memory in response to the control operation of the controller.

14. The memory system of claim 13, wherein the data path outputs data to the DRAM buffer memory in response to the control operation of the controller when the non volatile memory cell of the memory cell array performs an input or output operation in a block unit having a number of memory cells.

15. The memory system of claim 13, wherein the data path outputs data to the DRAM interface when the non volatile memory cell of the memory cell array performs an input or output operation in a memory cell unit.

16. The memory system of claim 14, wherein the DRAM buffer memory receives and buffers data from the data path and outputs the buffered data to the DRAM interface in response to the control operation of the controller and buffers data received from the DRAM interface and outputs the buffered data to the data path.

17. The memory system of claim 9, wherein the DRAM interface exchanges the data, the command and the address with the external device in the same way as a DRAM.

18. The memory system of claim 9, further comprising:
a DRAM storing data, wherein
the controller controls the DRAM in the same way that the controller controls the at least one non volatile memory device.

19. A memory system comprising:
a first non-volatile memory device;
a second non-volatile memory device different from the first non-volatile memory device;
a single controller controlling both the first non-volatile memory device and the second non-volatile memory device; and
a DRAM buffer having a plurality of dynamic memories, each of the dynamic memories including one transistor having a floating body and no capacitor, the DRAM buffer being interposed between the first non-volatile memory device, the second non-volatile memory device, and the single controller and enabling data to be passed from the single controller and the first non-volatile memory device and the second non-volatile memory device using a common protocol for both the first non-volatile memory device and the second non-volatile memory device.

20. The memory system of claim 19, wherein
the first non-volatile memory device is one of an EPROM, an EEPROM, and a flash memory; and
the second non-volatile memory device is another of an EPROM, an EEPROM, and a flash memory.

* * * * *